United States Patent [19]

Akamatsu

[11] Patent Number: 4,472,642
[45] Date of Patent: Sep. 18, 1984

[54] POWER SEMICONDUCTOR SWITCHING DEVICE

[75] Inventor: Masahiko Akamatsu, Amagasaki, Japan

[73] Assignee: Mitsubishi Denki Kabushiki Kaisha, Tokyo, Japan

[21] Appl. No.: 348,316

[22] Filed: Feb. 12, 1982

[51] Int. Cl.³ .......................................... H01L 29/74
[52] U.S. Cl. .......................... 307/252 C; 307/252 R; 307/255
[58] Field of Search ................ 307/252 R, 252 G, 255

[56] References Cited

U.S. PATENT DOCUMENTS

| | | | |
|---|---|---|---|
| 3,885,171 | 5/1975 | Hirano et al. | 307/252 A |
| 3,891,866 | 6/1975 | Okuhara et al. | 307/252 A |
| 4,224,634 | 9/1980 | Suedberg | 307/252 C |
| 4,398,205 | 8/1983 | Spellman et al. | 307/252 C |

Primary Examiner—Stanley D. Miller
Assistant Examiner—B. P. Davis
Attorney, Agent, or Firm—Oblon, Fisher, Spivak, McClelland & Maier

[57] ABSTRACT

A power semiconductor switching device comprises a first transistor which has semiconductor layers whose conductive types are alternately different in a first pattern and has an emitter connected to one end of a main circuit including a load; a second transistor which has a collector connected to the base of the first transistor, a base connected to the collector of the first transistor, an emitter connected to the other end of the main circuit, and semiconductor layers whose conductive types are alternately different in a second pattern; and a control transistor which has a paired main electrodes connected in parallel between the base and the emitter of at least one transistor in the first and second transistors to control load current passing between the emitter of the first transistor and the emitter of the second transistor by control of the base.

12 Claims, 9 Drawing Figures

POWER SEMICONDUCTOR SWITCHING DEVICE

BACKGROUND OF THE INVENTION

1. FIELD OF THE INVENTION

The present invention relates to a power semiconductor switching device. More particularly, it relates to an improvement in a gate controlled power semiconductor switching device.

2. DESCRIPTION OF THE PRIOR ART

FIG. 1 is a schematic sectional view showing the conventional gate turn-off thyristor device; and FIG. 2 is an equivalent circuit diagram of the thyristor device. At turn-off time, the load current is mainly passed through the highest resistance portion (5 n and 6 n in the equivalent circuit of the FIG. 2) in the central portion of the cathode-emitter away from the gate electrode because the transverse sheet resistance $R_{gk}$ of the gate layer $P_B$ between the cathode-emitter $N_E$ and the base layer $N_B$ is not negligible whereby the turn-off operation of the portion is difficult. Turn-off switching energy as "I (current)×V (voltage)×t (time)" in turn-off transient time is absorbed in the portion. As a result, a hot spot can easily result in the portion which is finally turned off.

In distinction from the transistor device, the thyristor has a pattern separating the contact surface by dividing the cathode-emitter $N_E$ into fine fragments in order to improve the turn-off characteristic whereby only certain parts of the cathode-emitters are turned on but the other parts remain without turn-on during the turn-off operation. In order to prevent the partial turn-on of the cathode-emitter from causing the total turning-on, an extremely large turn-on gate current [a turn-on gate current having low current amplification factor (less than 10 for Hfe) similar to a high voltage power transistor] is required.

In the application to an apparatus causing irregular rising time of forward load current (such as an inverter or a reversing driver DC servo motor), it is necessary to maintain the total conductive condition to expect rising of the load current whereby the forward gate current for maintaining the total conductive condition is as high as the base current of a power transistor.

The turn-off current gain is practically only about 3 to 5 whereby a reverse bias pulse generator is quite complicated.

Switching energy is locally concentrated at the turn-off time whereby allowable absorbing ability is low for the device as a whole. It is, therefore, necessary to provide a reapplied voltage dv/dt controlling circuit [a capacitor (1001), a diode (1002), a discharging resistor (1003) etc.] as shown by dotted line in FIG. 1. The capacitor (1001) corresponds to a commutation capacitor in a gate assisted turn-off thyristor device (U.S. Pat. No. 4,107,551) and a loss in the resistor (1003) is substantially equal to a loss of a thyristor force commutation circuit. Furthermore because, a silicon material is often required in comparison with a thyristor device, the process is complicated, economical and an effect can not be sufficiently attained, whereby many applications to main industrial apparatuses such as an uninterrupt power source, a chopper for cars, and variable frequency inverters operable near a commercial frequency, which have real demand, are prevented and the usage is limitted to only application to special devices or it has only an advantage as technological publications.

SUMMARY OF THE INVENTION

It is an object of the present invention to provide an improved gate controlled switching device and to provide an element having turn-off characteristics such as turn-off current gain, a turn-off switching energy absorbing ability etc. in comparison with the conventional gate turn-off thyristor device.

The foregoing and the other objects of the present invention have been attained by providing a power semiconductor switching device which comprises a first transistor which has semiconductor layers whose conductive types are alternately different in a first pattern and has an emitter connected to one end of a main circuit including a load; a second transistor which has a collector connected to the base of the first transistor, a base connected to the collector of the first transistor, an emitter connected to the other end of the main circuit and semiconductor layers whose conductive types are alternately different in a second pattern; and a control transistor which has a paired main electrodes connected in parallel between the base and the emitter of at least one transistor in the first and second transistors to control load current passing between the emitter of the first transistor and the emitter of the second transistor by controlling the base.

DETAILED DESCRIPTION OF THE PREFERRED EMBODIMENTS

Several embodiments of the present invention will be described with reference to drawings.

Figure 3:
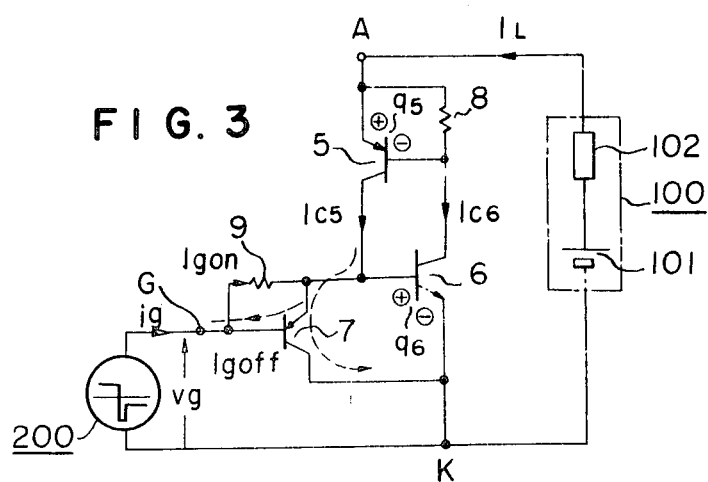
FIG. 3 is a circuit diagram of an embodiment of the power semiconductor switching device of the present invention.

FIG. 3 is a circuit diagram of one embodiment of a power semiconductor device of the present invention wherein the device has a PNP transistor and an NPN transistor whose bases are connected to each other's collectors and a gate-control transistor (7) having the emitter-collector connected in parallel between the base-emitter of one transistor (6) (referred to as the first transistor) of both the transistors. When a FET transistor is used, the drain and the source are connected in parallel between the base and the emitter. A base-emitter parallel resistor (8) for reducing storage time may be connected in parallel between the base-emitter of the other transistor (5) (referred to as the second transistor). If necessary, a turn-on trigger input resistor (9) is connected between the control electrode (the base) of the control transistor (7) and the base of the first transistor (6). Each emitter side (A or K) of the first and second transistors (5), (6) is inserted to a desired branch of a main circuit network (100) including a power source (101) and a load (102) to feed load current. The reference numeral (200) designates a control means connected between the emitter of the first transistor (6) and the base of the gate control transistor (7). The output waveform of the control means will be described with reference to FIG. 4.

Figure 4:
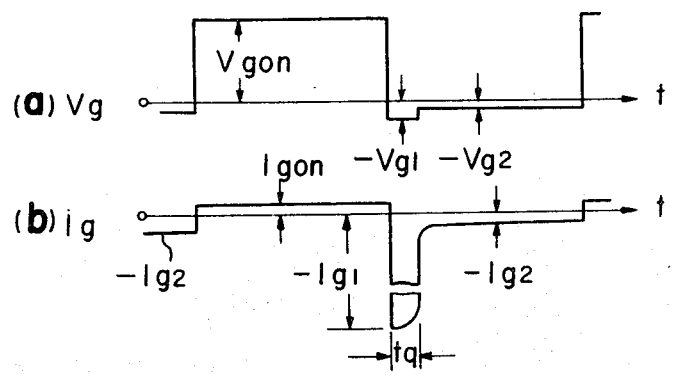
FIG. 4 is an operation diagram for showing the operation of the device as shown in FIG. 3.

FIG. 4 illustrates waveforms for the principle of the operation of an embodiment shown in FIG. 3. FIG. 4(a) illustrates a waveform of control voltage Vg, applied by the control means (200), across the control electrode G (base side of the gate-control transistor (7)) and the first main electrode K (the emitter of the first transistor (6)) and FIG. 4(b) illustrates the waveform of a controlled input current ig fed from the control means (200) to the control electrode G.

In FIG. 3, when forward trigger input Igon is applied from the control means (200) through a trigger-input resistor (9) to the base of the first transistor (6), a first transistor (6) is first turned on and collector current Ic6 passing through the resistor (8) starts to pass the base of the second transistor (5) whereby collector current Ic5 is fed in the collector of the second transistor (5). The collector current $I_{c5}$ feeds back to the base of the first transistor (6) by positive feed-back whereby the circuit of a pair of main electrodes A, K is rapidly turned on to pass load current $I_L$.

In the conductive state, the load current is passed as the collector current $I_{c6}$ or $I_{c5}$, that is, as the base current whereby the base current increase corresponding to the load current after the initiation of the turning-on, thus a large overcurrent resistance is provided. The conductive state is maintained under a balanced condition in which the product of the grounded emitter current amplification factor $H_{fe}$ of both the transistor (5), (6) is 1 whereby the requisite current amplification factor of both the transistors can be extremely small in comparison with Darlington connection. For example, when the current amplification factor $H_{fe}$ of the first transistor (6) is ranging 1 to 10, the current amplification factor $H_{fe}$ of the second transistor (5) can be ranging 0.1 to 1. Breakdown voltage for both the transistors (5), (6) can, therefore, be easily increased.

The turn-off operation of the embodiment will be described. At turning-off time, a large reverse-polarity control-electrode current $I_{g1}$ is supplied by the control means (200) in a first time period $t_q$ (FIG. 4). A turn-off controlling input $I_{goff}$ is fed between the emitter-base of the control transistor (7) which comprises semiconductor layers whose conductive types are alternately different in a pattern the same as that of the first transistor (6). As a result, the collector current $I_{c5}$ of the second transistor (5) is shunted through the emitter-collector of the control transistor (7). The shunt path is designated by the dotted arrow line in FIG. 3. As a result, the base current fed to the first transistor (6) becomes small or is lost. Alternatively, an electric charge q6 (designated by ⊕ ⊖ in FIG. 3) stored between the base-emitter of the first transistor (6) is discharged to change the base current of the first transistor (6) to reverse polarity. Thus, the collector current $I_{c6}$ of the first transistor (6) decreases, hence the collector current $I_{c5}$ of the second transistor (5) also decreases. At the moment, an electric charge q5 (designated by β ⊖ similar to q6) stored between the base-emitter of the second transistor (5) is discharged through the resistor (8) to accelerate the turning-off operation.

When the collector current $I_{c5}$ of the second transistor (5) is shunted to the control transistor (7), voltage drop is caused between the emitter-collector of the control transistor (7) thereby a small base current (a small current component passing at less than threshold voltage), thus the resulting residual collector current, caused in the first transistor (6) is shunted to the resistor (8). The turn-off time is shortened when the voltage drop caused by passing the residual collector current through the resistor (8) is less than the threshold voltage between the base-emitter of the second transistor (5). Furthermore, the turn-off operation is further accelerated by reversely biasing the base-emitter of the second transistor (5). Thus, the switching operation can be controlled through the control electrode G.

Figure 1:
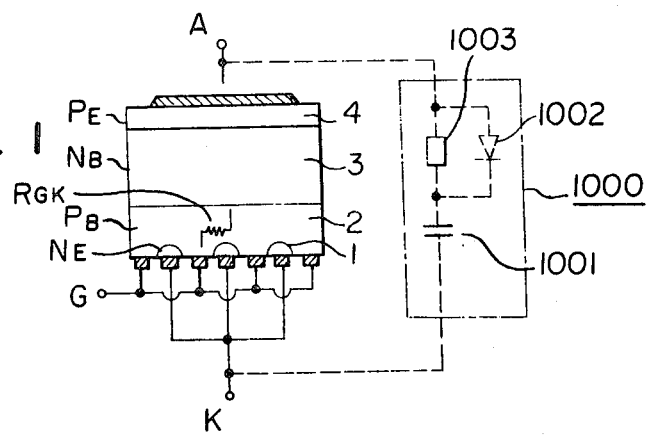
FIGS. 1 and 2 are schematic views of the conventional gate turn-off thyristor device.
Figure 2:
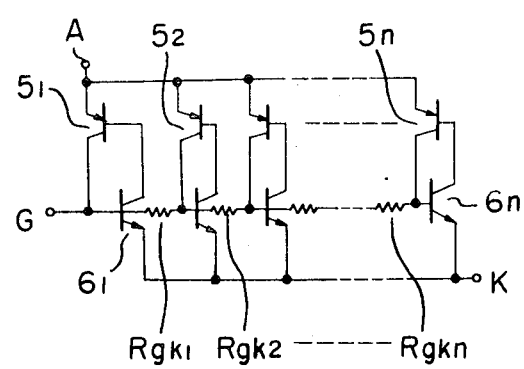

In the turn-off time, the voltage between the collector-emitter increases under the condition of passing current after the last turning-off operation whereby a turn-off switching power i.e. energy is mainly fed to the second transistor (5). Generally, it is unnecessary for a transistor to control the turn-off dv/dt and the absorbing energy of the transistor is greater than GTO. Since the current amplification factor of the transistor (5) can be extremely low, the thickness of the base layer can be increased. This means that the transistor is equivalent to an avalanche diode with regard to absorbable turn-off switching energy. Accordingly, the complicated dv/dt control circuit shown by the dotted line in FIG. 1 can be eliminated or a high frequency can be applied because of a large allowable switching loss.

Figure 6:
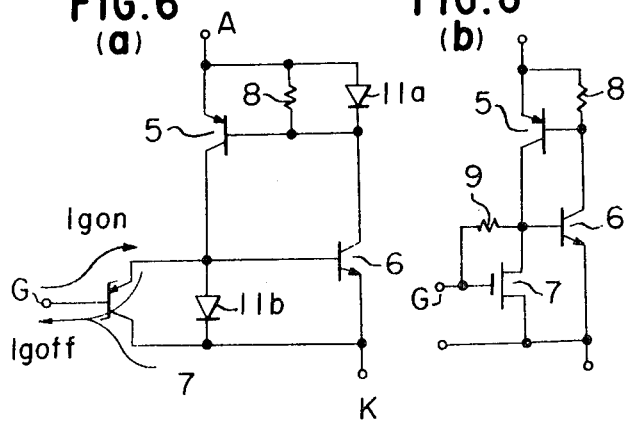
FIGS. 6a and 6b are respectively circuit diagrams of modified embodiments of the present invention.
FIG. 6c is a schematic sectional view of the power semiconductor switching device shown in FIG. 6b.

Only base-emitter voltage of the first transistor (6) is applied to the emitter-collector of the gate-control transistor (7) and the requesite withstand voltage is about 0.8 to 3 Volt whereby the current amplification factor of the gate control transistor (7) can be as high as 30–500 for $H_{fe}$. A field effect transistor can be used for the gate control transistor (7) as shown in FIG. 6(b) because it is sufficient to merely cut off a low voltage. As a result, turn-off control current $I_{goff}$ can be extremely small thereby simplifying the control means (200).

Figure 5:
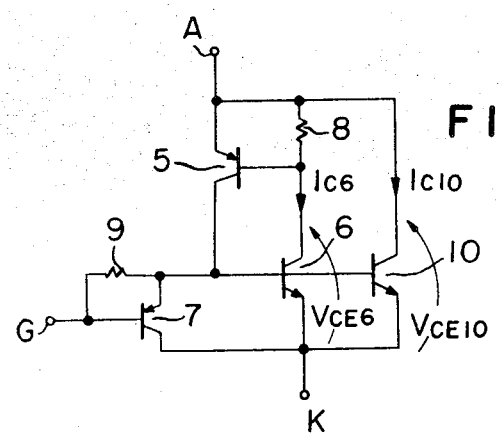
FIG. 5 is a circuit diagram of another embodiment of the present invention.

FIG. 5 is a circuit diagram of another embodiment of the present invention wherein a third transistor (10) has the base-emitter connected in parallel to the base-emitter of the first transistor (6) and the collector connected to the emitter of the second transistor (5). The third transistor (10) comprises semiconductive layers whose conductive types are alternately different in a pattern which is the same as that of the first transistor (6) and the base current of the third transistor (10) is fed from the collector of the second transistor (5) alike the first transistor (6). On the other hand, the load current is directly fed to the collector of the third transistor (10) to share the load current. At the moment, the collector-emitter voltage $V_{CE10}$ of the third transistor (10) is higher than the collector-emitter voltage $V_{CE6}$ of the first transistor (6) whereby the third transistor (10) operates in the condition that current amplification factor becomes higher. Generally, the base-emitter of a transistor has relatively high internal resistance. Accordingly, when the ratio of internal voltage drop across the base-emitter to the total voltage drop between terminals A and K (referred to as $V_{AK}$) is greater, the load current $I_L$ is directly fed as the collector current $I_{c10}$ without passing the base whereby the ratio of the load current to the voltage drop between the terminals A, K ($I_L/V_{AK}$) is lowered.

In FIG. 5, it is possible to provide a fourth transistor having the base and the emitter which are connected in parallel to the second transistor (5) and having the collector connected to the emitter of the first transistor.

FIG. 6(a) and 6(b) respectively designate modified embodiments of the present invention. FIG. 6(a) illustrates a circuit diagram in which an input resistor (9) as shown in FIGS. 4 and 5 is eliminated and alternatively turn-on trigger input current $I_{gon}$ is fed utilizing Zener diode characteristic (breakdown characteristic) between the base-emitter of the gate control transistor (7). It is possible to reduce main electrodes A-K voltage drop ($V_{AK}$) by respectively connecting a diode (11a) or (11b) between the base-emitter of the first transistor (5) or the second transistor (6) to shunt excessive collector current to these diodes (11a), (11b). That is, when there is an allowance for current amplification factor, a diode (11) is connected to either one or both of the transistors to control the amplitude of the base current thereby reducing internal voltage drop caused by the internal resistance of the base.

FIG. 6(b) illustrates another embodiment in which a field effect transistor is used instead of the gate control transistor (7) and FIG. 6(c) is a schematic sectional view of the field effect transistor (7) in FIG. 6(b). For a field effect transistor, a vertical type field effect transistor is suitably used to reduce the internal resistance as shown in FIG. 6(c). In the FIG. 6(c), the reference numeral (71) designates a P type or an N type semiconductive layer, (72) designates an oxidized layer and (73D), (73G) and (73S) respectively designate a drain contact, a gate contact and a source contact. The reason why a field effect transistor can be used as the gate control transistor (7) is that ON-OFF control in an extremely low voltage region can be performed. This allows to use a low voltage field effect element having a fine pattern such as IC.

Figure 7:
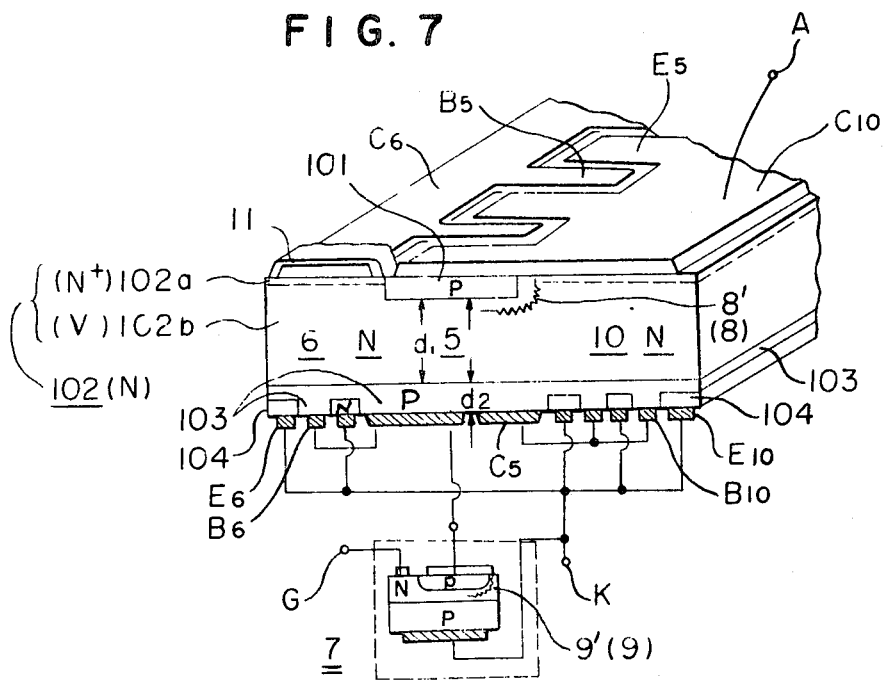
FIG. 7 is a schematic view of an embodiment of the semiconductor device of the present invention.

FIG. 7 is a schematic sectional view showing semiconductor structure of an embodiment of the semiconductor switch of the present invention. In the Figure, the reference numeral (101) designates a first semiconductor layer (such as a P type layer) as the emitter layer of the second transistor (5); (102) designates a second semiconductor layer (such as an N type or a $v$ type layer) as the base layer of the second transistor (5), the collector layer of the first transistor (6) and the collector layer of the third transistor (10); (103) designates a third semiconductor layer (such as a P type layer) as the collector layer of the second transistor (5), the base layer of the first transistor (6) and the base layer of the third transistor (10); and (104) designates a fourth semiconductor layer (such as an N type layer) as the emitter layer of the first transistor (6) and the emitter layer of the third transistor (10). The reference numerals $E_5$, $B_5$, $C_5$ respectively designate the emitter contact, the base contact and the collector contact of the second transistor (5); $E_6$, $B_6$, $C_6$ respectively designate the emitter contact, the base contact and the collector contact of the first transistor (6); and $E_{10}$, $B_{10}$, $C_{10}$ respectively designate the emitter contact, the base contact and the collector contact of the third transistor (10). The contacts $C_6$ and $B_5$, $C_{10}$ and $E_5$, $C_5$, $B_6$ and $B_{10}$, and $E_6$ and $E_{10}$ are respectively connected through their contacts. A seat resistor (8') extending from the base layer to the contact $C_{10}$ of the fifth transistor (5) is a base-emitter parallel resistor (8). In the FIG. 7, the reference numeral (11) designates an insulating coat (made of a material such as polyimide resin, aluminum oxide, silicon oxide etc.) covering the contacts $C_6$ and $B_5$ which is an insulating material used when the contacts $C_{10}$ and $E_5$ is brazed to a cooling plate. The short emitter part (9') of a separate control transistor (7) acts as a trigger input resistor (9).

Thus, the semiconductor device shown in FIG. 7 has an equivalent circuit of the embodiment as shown in FIG. 5. The semiconductor device can be an integrated semiconductor device depending upon various structures.

The thickness $d_1$ of the base layer of the second transistor (5) is greater than the thickness $d_2$ of the collector layer whereby the depletion layer extends to the base layer. That is, the base layer comprises a high relative-resistance semiconductor layer (such as $v$ type) of low impurity concentration (less than $10^{16}$ number/cm$^3$) whereby a transistor having low current amplification factor and an increased breakdown voltage can be economically obtained. Specifically, a transistor, as the second transistor (5) having the grounded emitter current amplification factor of about 0.1 to 1 can be obtained. The semiconductor device of the present invention has further advantage in that the device can be fabricated using silicon material, as a starting material, having the same conductive type as the first transistor (6) having a high current amplification factor.

In the semiconductor device of the present invention, the impurity concentration of the base layer (102b) of the second transistor (5) is lower than the impurity concentration of the collector layer (103) whereby the depletion layer extends to the base layer to absorb switching power (or energy) at the turn-off time by the avalanche characteristic between the semiconductor layers (102b), (103) (with regard to the second transistor (5)). Since the carrier feeding rate of the emitter layer (101) is low at the turning-off time, a uniform current distribution is provided to increase allowance of absorbed energy. As described above, a power semiconductor switching device of the present invention comprises a first transistor, a second transistor and a control transistor whose paired main electrodes are connected between the base-emitter of at least one of the transistors wherein load current is fed under a controlled condition between the emitter of the first transistor and the emitter of the second transistor. Thus, a gate-controlled power semiconductor switching device having an excellent turn-off characteristic can be obtained. In accordance with the present invention, turn-off current gain can be easily increased and durability for both applied voltage increasing rate after turning-off is extremely high.

I claim:

1. A power semiconductor switching device which comprises a first transistor which has semiconductor layers whose conductive types are alternately different in a first pattern and has an emitter connected to one end of a main circuit including a load, a second transistor which has a collector connected to the base of said first transistor, a base connected to the collector of said first transistor, an emitter connected to the other end of said main circuit, and semiconductor layers whose conductive types are alternately different in a second pattern; and a control transistor which has a pair of main electrodes connected in parallel between the base and the emitter of said first transistor to control load current passing between the emitter of said first transistor and the emitter of said second transistor by controlling the control electrode of said control transistor wherein said first transistor has a current amplification factor larger than said second transistor and wherein said second transistor is a PNP transistor with a base layer having a high relative-resistance layer and having a impurity concentration of less than $10^{16}/cm^3$.

2. A power semiconductor switching device according to claim 1 wherein an resistor element is connected in parallel between the base-emitter of a transistor other than a transistor connected to the pair of main electrodes of said control transistor in said first and second transistors.

3. A power semiconductor switching device according to claim 1 wherein said first transistor is a NPN transistor and the collector layer comprises a high relative-resistance layer having an impurity concentration of less than $10^{16}/cm^3$ and the base layer comprises a low relative resistance layer having an impurity concentration higher than that of said high relative-resistance layer.

4. A power semiconductor switching device according to any one of claims 1, 2 or 3 wherein said control transistor is a field effect transistor.

5. A power semiconductor switching device according to claim 4 wherein said field effect transistor is a vertical type field effect transistor.

6. A power semiconductor switching device which comprises a first transistor which has semiconductor layers whose conductive types are alternately different in a first pattern and has an emitter connected to one end of a main circuit network including a load; a second transistor which has a collector connected to the base of said first transistor, a base connected to the collector of said first transistor, an emitter connected to the other end of said main circuit, and semiconductor layers whose conductive types are alternately different in a second pattern; and a control transistor which has a pair of main electrodes connected in parallel between the base and the emitter of at least one transistor in said first and second transistors and which has a base connected to a control means; and a third transistor which has a base connected to the base of one transistor in said first and second transistors, an emitter connected to the emitter of said one transistor, a collector connected to the emitter of the other transistor in said first and second transistors, and semiconductor layers whose conductive types are alternately different in a pattern the same as that of said other transistor.

7. A power semiconductor switching device according to claim 6 wherein one of said first and second transistors is a transistor having a large current amplification factor and the other is a transistor having a small current amplification factor.

8. A power semiconductor switching device according to claim 6 or 7 wherein a resistor element is connected in parallel between the base-emitter of a transistor other than a transistor connected to the pair of main electrodes of said control transistor in said first and second transistors.

9. A power semiconductor switching device according to claim 6 or 7 wherein said second transistor is a PNP transistor and the base layer is a high relative-resistance layer having an impurity concentration of less than $10^{16}/cm^3$.

10. A power semiconductor switching device according to claim 9 wherein said first transistor is an NPN transistor and the collector layer comprises a high relative-resistance layer having an impurity concentration of less than $10^{16}/cm^3$ and the base layer comprises a low relative-resistance layer having an impurity concentration higher than that of said high relative-resistance layer.

11. A power semiconductor switching device according to any one of claims 6 or 7 wherein said control transistor is a field effect transistor.

12. A power semiconductor switching device according to claim 11 wherein said field effect transistor is a vertical type field effect transistor.

* * * * *